(12) United States Patent
Masunaga et al.

(10) Patent No.: US 11,837,599 B2
(45) Date of Patent: Dec. 5, 2023

(54) SEMICONDUCTOR DEVICE

(71) Applicant: Hitachi, Ltd., Tokyo (JP)

(72) Inventors: Masahiro Masunaga, Tokyo (JP); Shinji Nomoto, Tokyo (JP); Ryo Kuwana, Tokyo (JP); Isao Hara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 302 days.

(21) Appl. No.: 17/497,639

(22) Filed: Oct. 8, 2021

(65) Prior Publication Data

US 2022/0149035 A1 May 12, 2022

(30) Foreign Application Priority Data

Nov. 9, 2020 (JP) ................................ 2020-186277

(51) Int. Cl.
*H01L 27/02* (2006.01)
*H01L 29/16* (2006.01)

(52) U.S. Cl.
CPC ...... *H01L 27/0255* (2013.01); *H01L 29/1608* (2013.01)

(58) Field of Classification Search
None
See application file for complete search history.

(56) References Cited

U.S. PATENT DOCUMENTS

| 6,770,938 B1* | 8/2004 | Fliesler | H01L 27/0255 |
| | | | 257/361 |
| 2001/0053054 A1* | 12/2001 | Andoh | H01L 27/0255 |
| | | | 361/56 |
| 2008/0013231 A1* | 1/2008 | Bazzano | H01L 27/0259 |
| | | | 361/56 |
| 2017/0323882 A1* | 11/2017 | Langguth | H01L 27/1207 |

FOREIGN PATENT DOCUMENTS

JP        H02214151 A    8/1990

OTHER PUBLICATIONS

Search Report dated Mar. 25, 2022 in European Application No. 21201437.7.
M. Masunaga et a. "4H-Sic CMOS Transimpedance Amplifier of Gamma-Irradiation Resistance Over 1 MGy." IEEE Transactions on Electron Devices, Jan. 2020 vol. 67, No. 1, pp. 224-229.

* cited by examiner

*Primary Examiner* — Bilkis Jahan
(74) *Attorney, Agent, or Firm* — Miles & Stockbridge, P.C.

(57) ABSTRACT

A semiconductor device includes an electrostatic protection circuit 1 and a MOSFET 2 including a gate terminal. The electrostatic protection circuit 1 includes a positive-side power supply terminal 3, a negative-side power supply terminal 5, a first protection diode 4, a second protection diode 6, a resistance element 7, and a bipolar transistor 8. The second protection diode 6 includes an anode terminal electrically connected to the negative-side power supply (Continued)

1: ELECTROSTATIC PROTECTION CIRCUIT
2: MOSFET
3: POSITIVE-SIDE POWER SUPPLY TERMINAL
4: FIRST PROTECTION DIODE
5: NEGATIVE-SIDE POWER SUPPLY TERMINAL
6: SECOND PROTECTION DIODE
7: RESISTANCE ELEMENT
8: BIPOLAR TRANSISTOR terminal 5 via the resistance element 7, and a cathode terminal electrically connected to the gate terminal. The bipolar transistor 8 includes a base terminal, an emitter terminal, and a collector terminal. The bipolar transistor 8 is electrically connected to the anode terminal of the second protection diode 6, the gate terminal, and the positive-side power supply terminal 3. The electrostatic protection circuit 1 is formed on a semiconductor substrate made of silicon carbide.

7 Claims, 10 Drawing Sheets

FIG. 1

1: ELECTROSTATIC PROTECTION CIRCUIT
2: MOSFET
3: POSITIVE-SIDE POWER SUPPLY TERMINAL
4: FIRST PROTECTION DIODE
5: NEGATIVE-SIDE POWER SUPPLY TERMINAL
6: SECOND PROTECTION DIODE
7: RESISTANCE ELEMENT
8: BIPOLAR TRANSISTOR

FIG. 2

FIG. 3
A-A CROSS-SECTION

SEMICONDUCTOR DEVICE

BACKGROUND OF THE INVENTION

1. Field of the Invention

The present invention relates to a semiconductor device, and more particularly to a semiconductor device using a semiconductor substrate made of silicon carbide.

2. Description of Related Art

A protection circuit that protects a transistor from static electricity is incorporated in a semiconductor device (semiconductor chip) in which an integrated circuit (IC) such as an amplification circuit is formed. In particular, in a complementary metal oxide semiconductor field effect transistor (MOSFET), so-called CMOS, since a thin gate insulating film is employed below a gate electrode, there is a concern that a surge voltage due to static electricity will be applied to the gate electrode and the gate insulating film will be destroyed.

Figure 7:
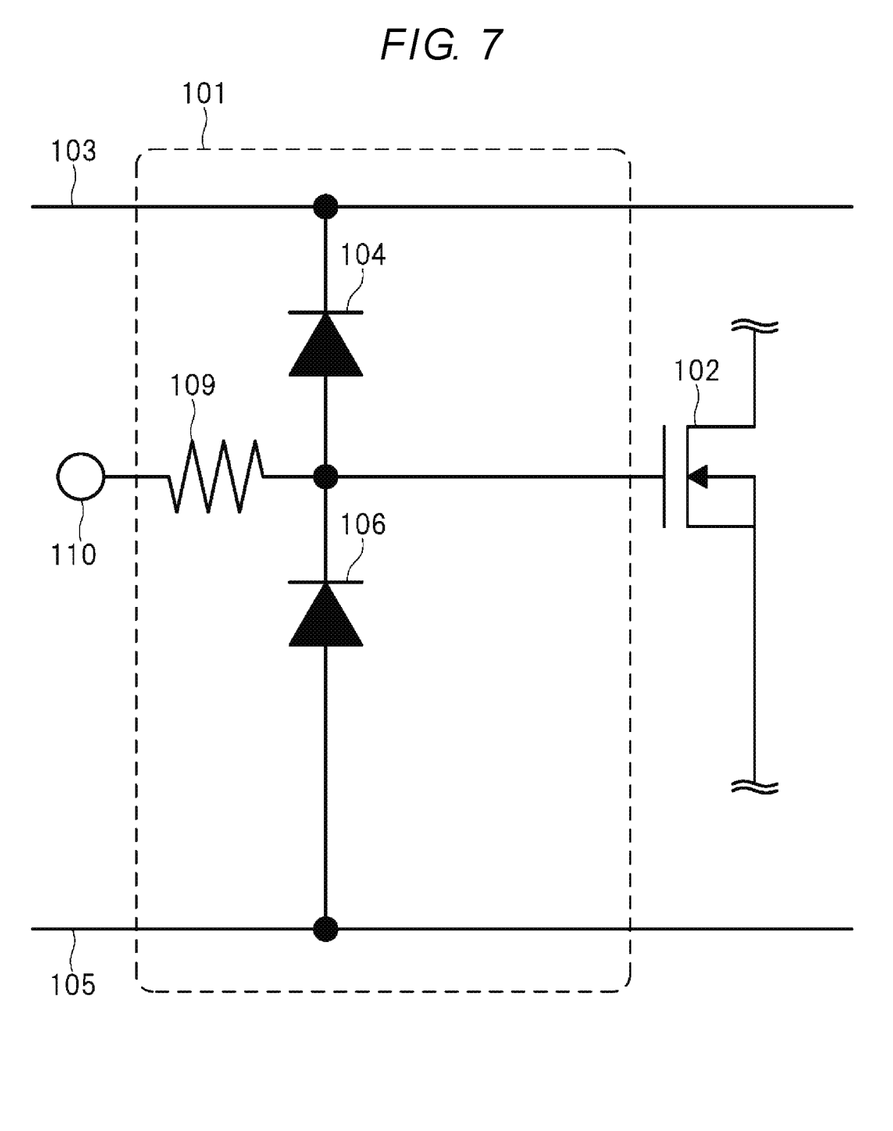
FIG. 7 is a circuit diagram illustrating a semiconductor device in an examination example.

FIG. 7 illustrates an example of an electrostatic protection circuit built in a semiconductor device. The surge voltage applied to an input terminal 110 is clamped to a positive-side power supply terminal 103 or a negative-side power supply terminal 105 by a resistance element 109, a first protection diode 104, and a second protection diode 106 included in an electrostatic protection circuit 101. With this configuration, it is possible to prevent a large voltage from being applied to a gate terminal (gate electrode) of a MOSFET 102.

Meanwhile, in the semiconductor device, ion implantation, annealing treatment, and the like are performed on a front surface of a semiconductor substrate represented by silicon (Si), and a metal wiring is formed on the semiconductor substrate through a patterning process or the like. After that, the semiconductor device is mounted as a package form such as a quad flat non lead package (QFN) through a process of cutting the semiconductor substrate or the like. In these cutting and mounting processes (post-process), the semiconductor device comes into physical contact with various manufacturing devices, but if the manufacturing device is charged, there is a concern that the gate insulating film may be destroyed due to electric discharge. Usually, dielectric breakdown of such a mechanical model requires an electrostatic withstand voltage of 200 V or more.

For example, M. Masunaga, S. Sato, R. Kuwana, N. Sugii, and A. Shima, "4H-SiC CMOS Transimpedance Amplifier of Gamma-Irradiation Resistance Over 1 MGy." IEEE Transactions on Electron Devices, vol. 67, no. 1, pp. 224-229, January 2020 discloses that the same withstand voltage is required for the CMOS using a semiconductor substrate made of silicon carbide (SiC).

Figure 8:
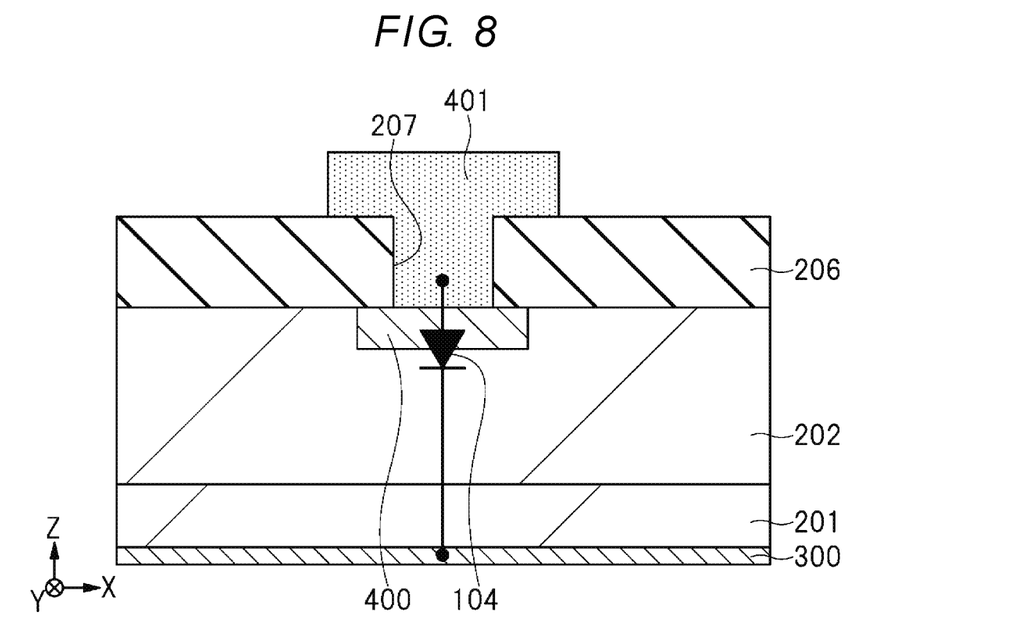
FIG. 8 is a cross-sectional view illustrating a first protection diode in the examination example.
Figure 9:
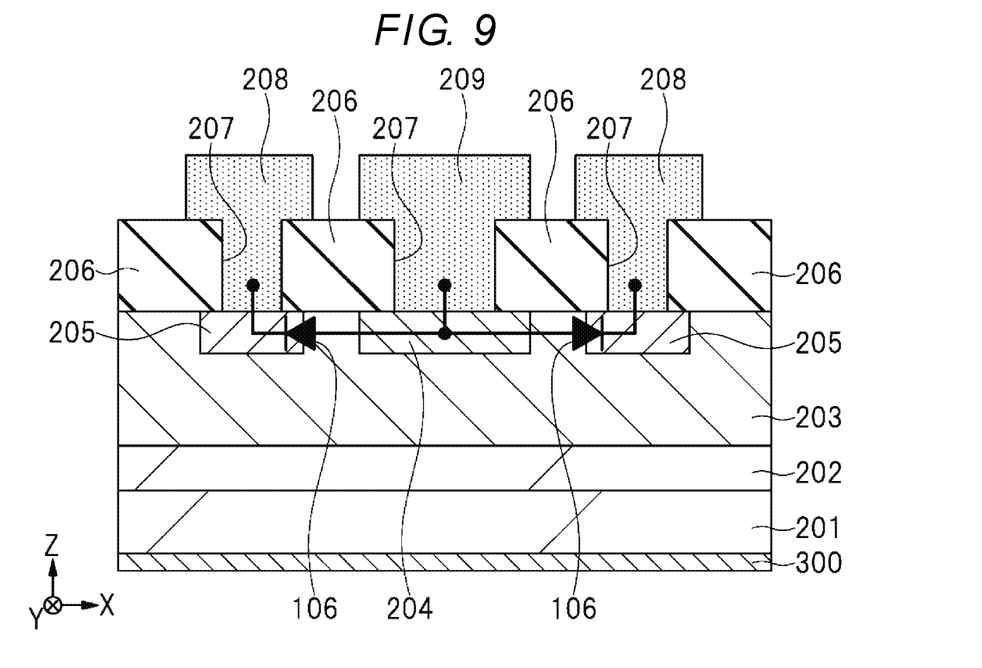
FIG. 9 is a cross-sectional view illustrating a second protection diode in the examination example.

Hereinafter, a semiconductor device of an examination example examined by the inventors of the present application and its problems will be described with reference to FIGS. 7 to 10. FIG. 7 illustrates an example of the electrostatic protection circuit 101 built in the semiconductor device in the examination example, FIG. 8 is a cross-sectional view illustrating the first protection diode 104, and FIG. 9 is a cross-sectional view illustrating the second protection diode 106.

First, the first protection diode 104 will be described. As illustrated in FIG. 8, on an n-type semiconductor substrate 201 made of SiC, an epitaxial layer 202, which has an impurity concentration lower than that of the semiconductor substrate 201, is made of SiC, and is n⁻-type, is formed. A p-type high-concentration diffusion layer 400 is formed in the epitaxial layer 202. An interlayer insulating film 206 is formed on the epitaxial layer 202, and a contact hole 207 is formed in the interlayer insulating film 206. A wiring 401 is formed on the interlayer insulating film 206 so as to embed the contact hole 207. The wiring 401 is connected to the p-type high-concentration diffusion layer 400. A back surface electrode 300 is formed on a back surface of the semiconductor substrate 201.

In the first protection diode 104, the p-type high-concentration diffusion layer 400 serves as an anode terminal, the n⁻-type epitaxial layer 202 serves as an intrinsic semiconductor layer, and the n-type semiconductor substrate 201 serves as a cathode terminal. That is, the first protection diode 104 has a p/n⁻/n structure.

Since the semiconductor substrate 201 made of SiC is mainly n-type, it is necessary to make the semiconductor substrate 201 high potential. For that reason, the back surface electrode 300 is electrically connected to the positive-side power supply terminal 103 in FIG. 7.

Since the p-type high-concentration diffusion layer 400 is electrically connected to the input terminal 110 of FIG. 7 via the wiring 401 or the like, an anode current flows in a vertical direction (Z-direction). The first protection diode 104 is suitable for the electrostatic protection circuit 101 because the first protection diode 104 is easy to make the current large in a vertical device such as the first protection diode 104.

Next, the second protection diode 106 will be described. The second protection diode 106 is formed in the epitaxial layer 202 in a region different from that of the first protection diode 104. As illustrated in FIG. 9, a p⁻-type diffusion layer 203 is formed on the epitaxial layer 202, and a p-type high-concentration diffusion layer 204 and an n-type high-concentration diffusion layer 205 are formed on the p⁻-type diffusion layer 203. A plurality of contact holes 207 are formed in the interlayer insulating film 206. Wirings 208 and wirings 209 are respectively formed on the interlayer insulating film 206 so as to embed the plurality of contact holes 207. The wiring 209 is connected to the p-type high-concentration diffusion layer 204, and the wiring 208 is connected to the n-type high-concentration diffusion layer 205.

In the second protection diode 106, the p-type high-concentration diffusion layer 204 serves as an anode terminal, the p⁻-type diffusion layer 203 serves as an intrinsic semiconductor layer, and the n-type high-concentration diffusion layer 205 serves as a cathode terminal. That is, the second protection diode 106 has a p/p⁻/n structure.

The p-type high-concentration diffusion layer 204 is electrically connected to the negative-side power supply terminal 105 of FIG. 7 via the wiring 209 or the like, and the n-type high-concentration diffusion layer 205 is electrically connected to the input terminal 110 of FIG. 7 via the wiring 208 or the like.

The anode current of the second protection diode 106 flows in the horizontal direction (X-direction) in a region where the p-type high-concentration diffusion layer 204 and the n-type high-concentration diffusion layer 205 face each other. In general, it is difficult to make the current large in a horizontal device such as the second protection diode 106. Furthermore, in the semiconductor device using the semiconductor substrate 201 made of SiC, since the lifetime of minority carriers of the p⁻-type diffusion layer 203 formed by an ion implantation method is about an order of magnitude lower than that of the lifetime of minority carriers of the n-type epitaxial layer 202, conductivity modulation is not promoted. Therefore, the anode current of the second protection diode 106 is even lower than the anode current of the first protection diode 104.

Figure 10:
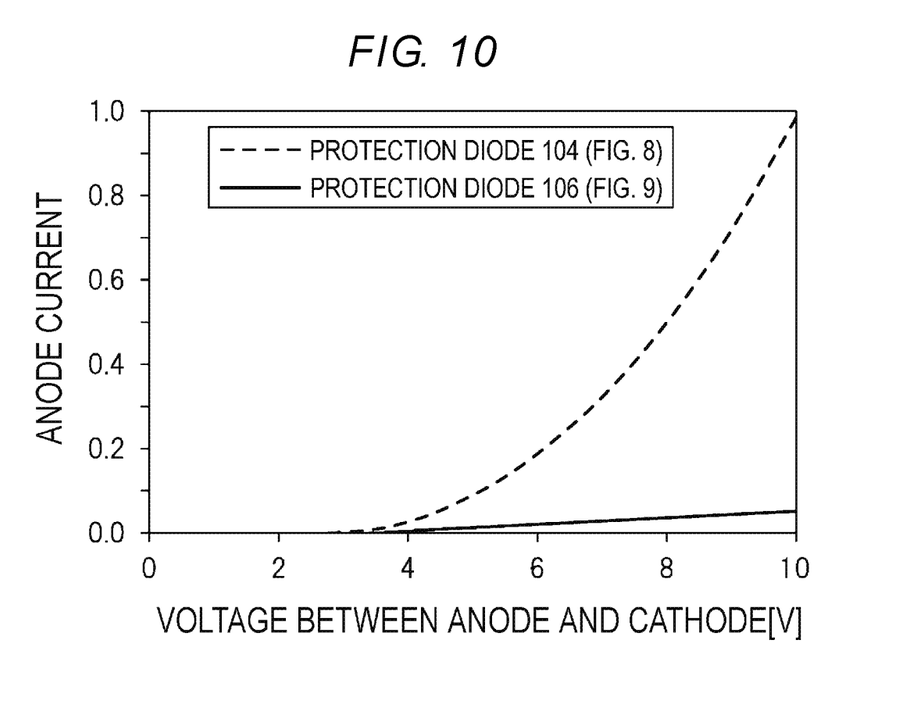
FIG. 10 is a graph illustrating measurement results by the inventors of the present application.

FIG. 10 is a graph illustrating the results measured by the inventors of the present application regarding the current and voltage characteristics of each protection diode per unit area.

As illustrated in FIG. 10, when a voltage between an anode and a cathode is compared at 10 V, the anode current of the second protection diode 106 is about one-twentieth of the anode current of the first protection diode 104. This result means that an area of the second protection diode 106 needs to be about twenty times larger than an area of the first protection diode 104 in order to secure the same electrostatic withstand voltage. An increase in the total area of the protection diode directly leads to an increase in the cost of the semiconductor device.

As described above, when the electrostatic protection circuit 101 illustrated in FIG. 7 is to be configured in the semiconductor device using the semiconductor substrate 201 made of SiC, an absolute amount of the anode current is small in the second protection diode 106 connected to the negative-side power supply terminal 105, and thus it is difficult to cope with both securing a sufficient electrostatic withstand voltage and suppressing an increase in cost.

Therefore, a technique capable of suppressing an increase in the area of the entire protection diode and securing a sufficient electrostatic withstand voltage is desired. That is, a technique capable of suppressing an increase in the cost of a semiconductor device and improving the reliability of the semiconductor device is desired. Other problems and novel features will become apparent from the description and accompanying drawings of the present specification.

SUMMARY OF THE INVENTION

A summary of representative embodiments disclosed in the present application is as follows.

A semiconductor device according to one embodiment includes an electrostatic protection circuit and a MOSFET including a gate terminal. The electrostatic protection circuit includes a positive-side first power supply terminal, a negative-side second power supply terminal, a first protection diode including a first cathode terminal electrically connected to the first power supply terminal and a first anode terminal electrically connected to the gate terminal, a second protection diode including a second anode terminal electrically connected to the second power supply terminal via a first resistance element, and a second cathode terminal electrically connected to the gate terminal, and a bipolar transistor including a base terminal, an emitter terminal, and a collector terminal. The first protection diode, the second protection diode, the bipolar transistor, and the first resistance element are respectively formed on a semiconductor substrate made of silicon carbide. The bipolar transistor is electrically connected to the second anode terminal, the gate terminal, and the first power supply terminal.

According to one embodiment, it is possible to suppress an increase in the cost of the semiconductor device and improve the reliability of the semiconductor device.

DESCRIPTION OF EMBODIMENTS

Hereinafter, embodiments of the present invention will be described in detail with reference to the drawings. In all the drawings for describing the embodiments, the members having the same function are designated by the same reference numerals, and the repeated description thereof will be omitted. In the following embodiments, the description of the same or similar parts is not repeated in principle unless it is particularly necessary.

The X-direction, the Y-direction, and the Z-direction described in the present application intersect each other and are orthogonal to each other. In the present application, the Z-direction is described as a longitudinal direction, a vertical direction, a height direction, or a thickness direction of a certain structure. The expression "in plan view" used in the present application means that a surface composed of the X-direction and the Y-direction is viewed from the Z-direction.

Embodiment 1

A semiconductor device (semiconductor chip) according to Embodiment 1 will be described below with reference to FIGS. 1 to 6.

Figure 1:
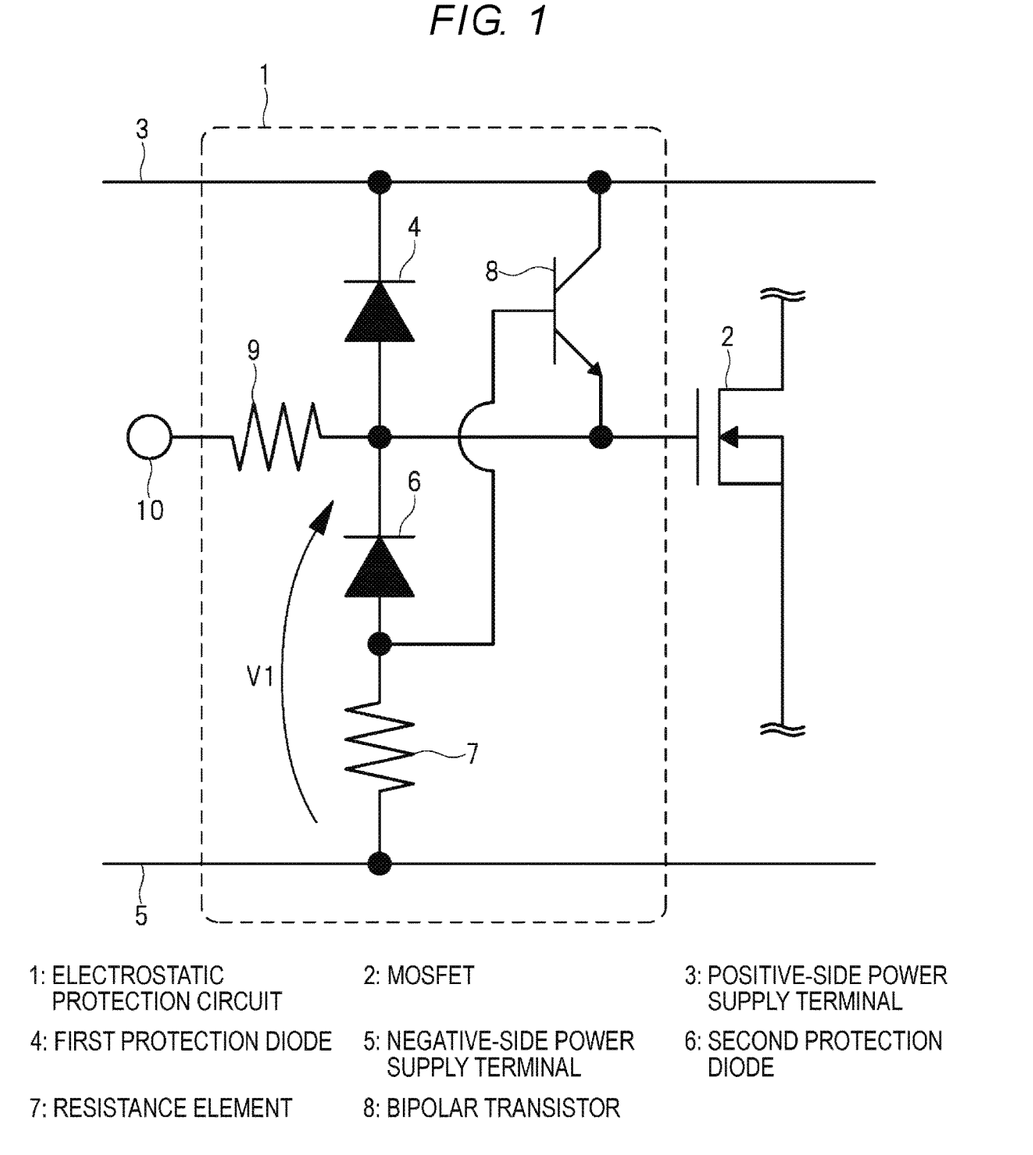
FIG. 1 is a circuit diagram illustrating a semiconductor device according to Embodiment 1.

As illustrated in FIG. 1, the semiconductor device includes at least an electrostatic protection circuit 1 and a MOSFET 2 including a gate terminal. The electrostatic protection circuit 1 includes a positive-side power supply terminal 3, a negative-side power supply terminal 5, a first protection diode 4, a second protection diode 6, a resistance element 7, a bipolar transistor 8, and a resistance element 9.

The first protection diode 4 includes a cathode terminal electrically connected to the positive-side power supply terminal 3 and an anode terminal electrically connected to the gate terminal of the MOSFET 2. The second protection diode 6 includes an anode terminal electrically connected to the negative-side power supply terminal 5 via the resistance element 7 and a cathode terminal electrically connected to the gate terminal of the MOSFET 2.

The bipolar transistor 8 includes a base terminal, an emitter terminal, and a collector terminal, and is electrically connected to the anode terminal of the second protection diode 6, the gate terminal of the MOSFET 2, and the positive-side power supply terminal 3.

A voltage V1 illustrated in FIG. 1 indicates a voltage between the cathode terminal of the second protection diode 6 and the negative-side power supply terminal 5.

As will be described in detail later, the first protection diode 4, the second protection diode 6, the resistance element 7, the bipolar transistor 8, and the MOSFET 2 are respectively formed on a semiconductor substrate 21 made of silicon carbide (SiC). In other words, these elements are contained in the same semiconductor device.

The anode terminal of the first protection diode 4, the cathode terminal of the second protection diode 6, the emitter terminal of the bipolar transistor 8, and the gate terminal of the MOSFET 2 are electrically connected to the input terminal 10 via the resistance element 9, respectively. The cathode terminal of the first protection diode 4 and the collector terminal of the bipolar transistor 8 are electrically connected to the positive-side power supply terminal 3, respectively. The anode terminal of the second protection diode 6 and the base terminal of the bipolar transistor 8 are electrically connected to the negative-side power supply terminal 5 via the resistance element 7, respectively.

When negative electrode static electricity is applied to the input terminal 10, a potential of the resistance element 7 is increased according to an anode current flowing through the second protection diode 6. When the potential of the resistance element 7 exceeds a built-in potential (about 2.5 V) and the anode current exceeds a predetermined value, the bipolar transistor 8 is turned ON.

As described above, as a problem of the present application, there is a problem that an absolute amount of the anode current is small in the second protection diode 6 connected to the negative-side power supply terminal 5. Therefore, it is necessary to increase an area of the second protection diode 6 in order to obtain a sufficient electrostatic withstand voltage. That is, there is a problem that it is difficult to cope with both securing the electrostatic withstand voltage and suppressing the increase in cost due to the increase in area.

Here, in Embodiment 1, when the bipolar transistor 8 is turned ON, a collector current flows between the positive-side power supply terminal 3 and the MOSFET 2. In the post-process, no voltage is applied to each power supply terminal, and thus the collector current complements the anode current. For that reason, a surge voltage can be suppressed by the second protection diode 6 and the bipolar transistor 8. Therefore, it is possible to suppress an increase in the area of the entire protection diode and secure a sufficient electrostatic withstand voltage.

Specific structures of the second protection diode 6, the bipolar transistor 8, and the resistance element 7 will be described below with reference to FIGS. 2 and 3. FIG. 3 is a cross-sectional view taken along line A-A illustrated in the plan view of FIG. 2.

The semiconductor substrate 21 illustrated in FIG. 3 is made of SiC, is n-type, and has a front surface and a back surface. Above the front surface of the semiconductor substrate 21, an epitaxial layer 22, which is made of SiC and is n$^-$-type, is formed. A p$^-$-type diffusion layer 23 is formed in the epitaxial layer 22. A p-type high-concentration diffusion layer 24 and an n-type high-concentration diffusion layer 25 are formed in the p$^-$-type diffusion layer 23. The n-type high-concentration diffusion layer 25 is formed so as to be separated from the p-type high-concentration diffusion layer 24. For that reason, the p$^-$-type diffusion layer 23 exists between the n-type high-concentration diffusion layer 25 and the p-type high-concentration diffusion layer 24.

Figure 2:
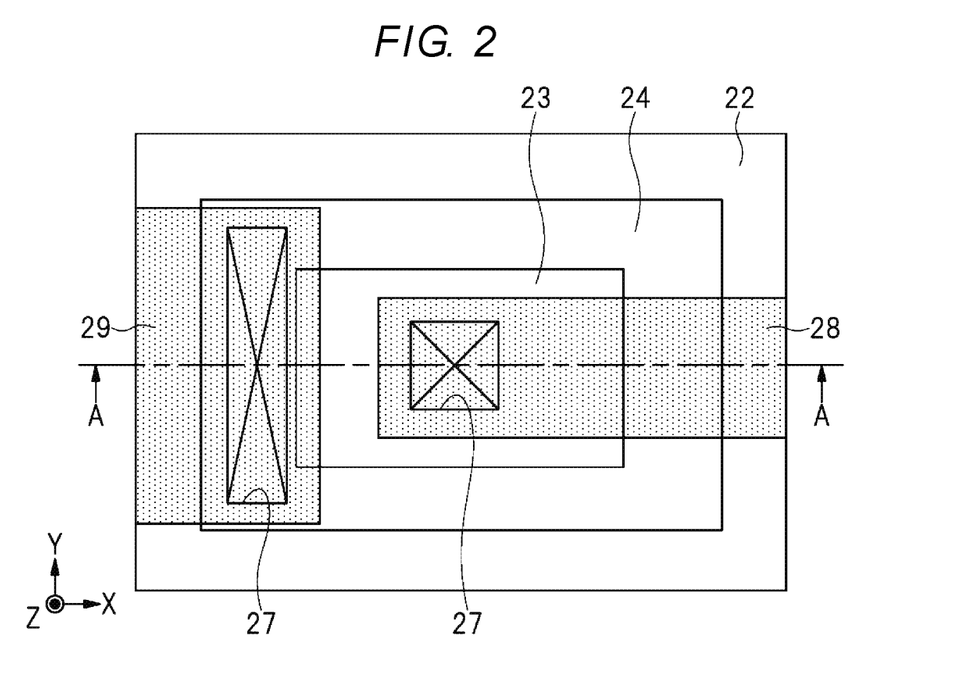
FIG. 2 is a plan view illustrating a second protection diode, a bipolar transistor, and a resistance element according to Embodiment 1.
Figure 3:
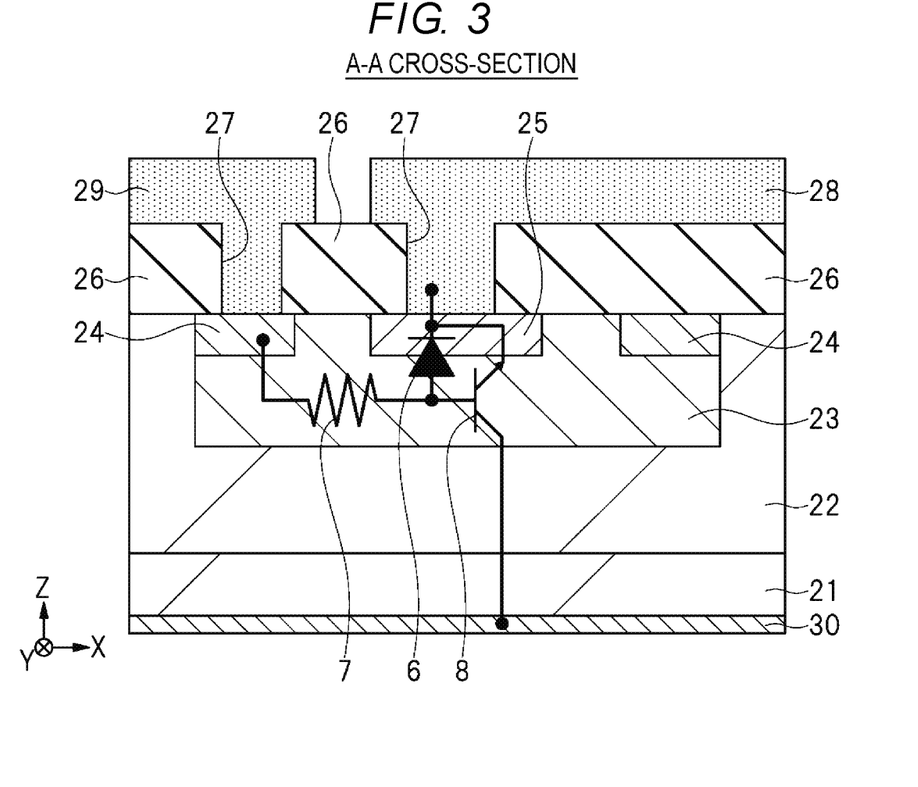
FIG. 3 is a cross-sectional view illustrating the second protection diode, the bipolar transistor, and the resistance element according to Embodiment 1.

As illustrated in FIG. 2, the p$^-$-type diffusion layer 23 is surrounded by the n$^-$-type epitaxial layer 22 in plan view.

The n-type high-concentration diffusion layer 25 is disposed at the bottom of a contact hole 27 in which a wiring 28 is formed. Therefore, the p-type high-concentration diffusion layer 24 is formed on the outer periphery of the p$^-$-type diffusion layer 23 so as to surround the n-type high-concentration diffusion layer 25 in plan view.

The parameters such as an impurity concentration contained in each configuration are as follows.

The n-type semiconductor substrate 21 has, for example, an impurity concentration of $1\times10^{18}$ to $1\times10^{21}$ cm$^{-3}$.

The n$^-$-type epitaxial layer 22 has, for example, a thickness of less than 1 μm, has an impurity concentration lower than that of the n-type semiconductor substrate 21, and has, for example, the impurity concentration of $1\times10^{14}$ to $1\times10^{15}$ cm$^{-3}$.

The p$^-$-type diffusion layer 23 has the impurity concentration of, for example, $1\times10^{16}$ to $1\times10^{18}$ cm$^{-3}$.

The p-type high-concentration diffusion layer 24 has an impurity concentration higher than that of the p$^-$-type diffusion layer 23, and has the impurity concentration of, for example, $1\times10^{20}$ cm$^{-3}$ or more.

The n-type high-concentration diffusion layer 25 has an impurity concentration higher than that of the n$^-$-type epitaxial layer 22, and has the impurity concentration of, for example, $1\times10^{20}$ cm$^{-3}$ or more.

The cathode terminal of the second protection diode 6 is configured to include the n-type high-concentration diffusion layer 25, and the anode terminal of the second protection diode 6 is configured to include the p-type high-concentration diffusion layer 24. The p$^-$-type diffusion layer 23 constitutes an intrinsic semiconductor layer. That is, the second protection diode 6 has a p/p$^-$/n structure.

The base terminal of the bipolar transistor 8 is configured to include the p$^-$-type diffusion layer 23, and the emitter terminal of the bipolar transistor 8 is configured to include the n-type high-concentration diffusion layer 25. The collector terminal of the bipolar transistor 8 is configured to include the n$^-$-type epitaxial layer 22 and the n-type semiconductor substrate 21 located below the p$^-$-type diffusion layer 23.

An amplification factor of the bipolar transistor 8 can be adjusted by the thickness of the p$^-$-type diffusion layer 23 sandwiched between the n$^-$-type epitaxial layer 22 and the n-type high-concentration diffusion layer 25 and the concentration of impurities of the layers.

The resistance element 7 is configured to include the p$^-$-type diffusion layer 23 located between the n-type high-concentration diffusion layer 25 and the p-type high-concentration diffusion layer 24. A resistance value of the resistance element 7 can be designed to an appropriate value by adjusting the distance between the n-type high-concentration diffusion layer 25 and the p-type high-concentration diffusion layer 24 and the thickness (depth) of the p$^-$-type diffusion layer 23. Then, the ON state and the OFF state of the bipolar transistor 8 are switched according to the potential applied to the resistance element 7.

An interlayer insulating film 26 is formed on the epitaxial layer 22, and a plurality of contact holes 27 are formed in the interlayer insulating film 26. The wiring 28 and a wiring 29 are formed on the interlayer insulating film 26 so as to embed the plurality of contact holes 27. The wiring 28 is connected to the n-type high-concentration diffusion layer 25, and the wiring 29 is connected to the p-type high-concentration diffusion layer 24. A back surface electrode 30 is formed on the back surface of the semiconductor substrate 21.

The positive-side power supply terminal 3 is configured to include the back surface electrode 30. The negative-side power supply terminal 5 is configured to include the wiring 29. Since the collector terminal of the bipolar transistor 8 is electrically connected to the back surface electrode 30, it is possible to make the current large. Since the collector terminal is not drawn out from the main front surface of the epitaxial layer 22, it can also contribute to the omission of metal wiring.

Figure 4:
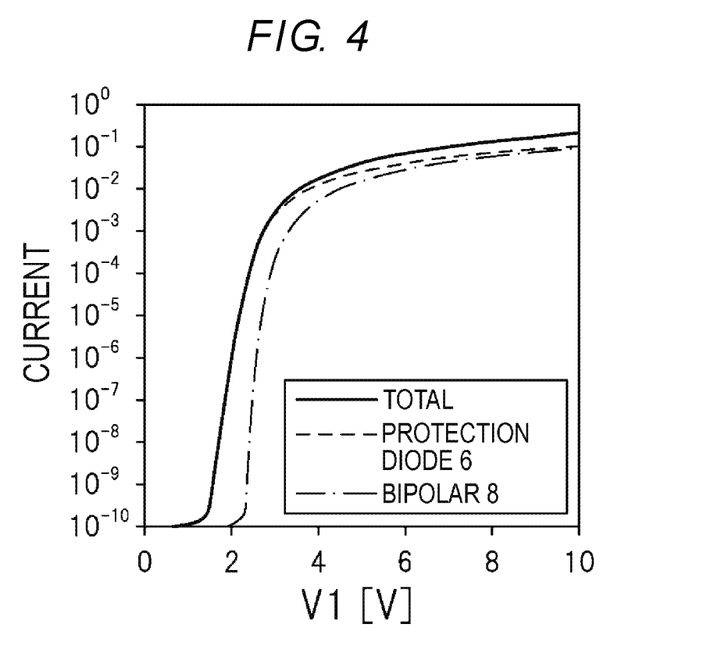
FIG. 4 is a graph illustrating measurement results by the inventors of the present application.
Figure 5:
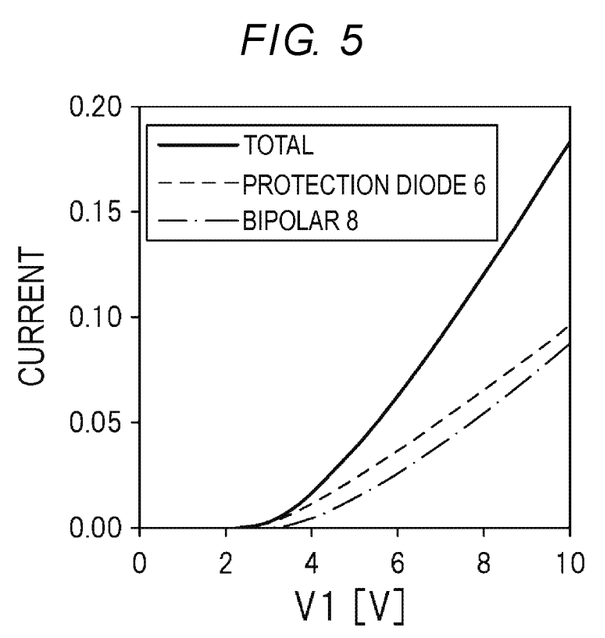
FIG. 5 is a graph illustrating measurement results by the inventors of the present application.

FIGS. 4 and 5 are graphs illustrating the current and voltage characteristics of the second protection diode 6 and the bipolar transistor 8. The graph of FIG. 4 is represented on a log scale, and the graph of FIG. 5 is represented on a linear scale.

As illustrated in FIGS. 4 and 5, the total current of the second protection diode 6 and the bipolar transistor 8 is larger than the current of the second protection diode 6 alone, and can be about twice the current of the second protection diode 6 alone. Therefore, the increase in the area of the entire protection diode can be suppressed, and the increase in the cost of the semiconductor device can be suppressed.

As described above, according to Embodiment 1, an increase in the cost of the semiconductor device can be suppressed and the reliability of the semiconductor device can be improved.

Figure 6:
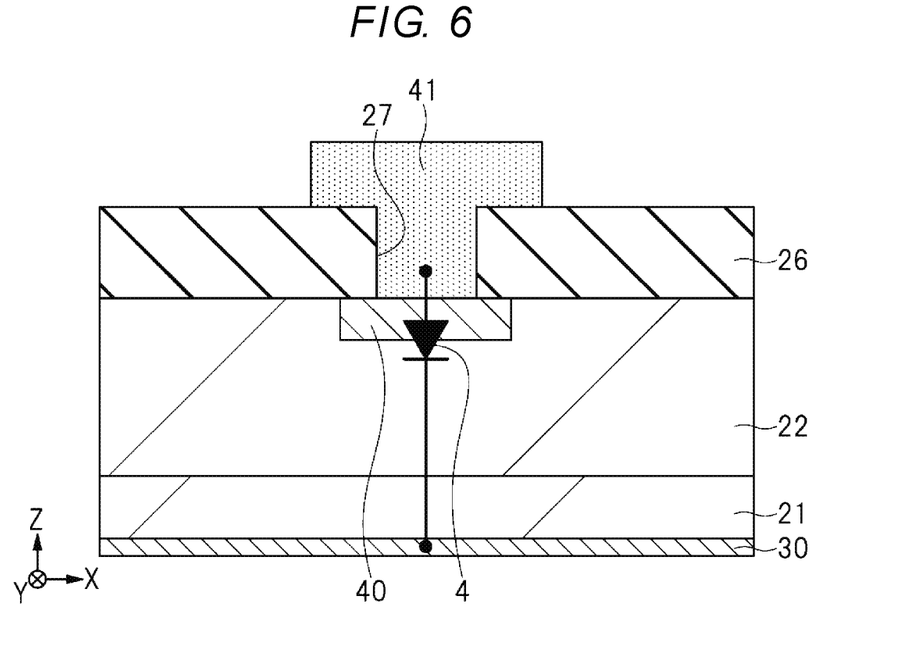
FIG. 6 is a cross-sectional view illustrating a first protection diode according to Embodiment 1.

Hereinafter, the first protection diode 4 and the MOSFET 2 provided in the semiconductor device will be described. The first protection diode 4 and the MOSFET 2 are formed on the semiconductor substrate 21 in a region different from that of the second protection diode 6, the bipolar transistor 8, and the resistance element 7.

FIG. 6 is a cross-sectional view illustrating the first protection diode 4. The structure of the first protection diode 4 is almost the same as the structure of the first protection diode 104 of FIG. 8 in the examination example.

A p-type high-concentration diffusion layer 40 is formed on the epitaxial layer 22 in a region different from the p⁻-type diffusion layer 23. The interlayer insulating film 26 is formed on the epitaxial layer 22, and the contact hole 27 is formed in the interlayer insulating film 26. A wiring 41 is formed on the interlayer insulating film 26 so as to embed the contact hole 27. The wiring 41 is connected to the p-type high-concentration diffusion layer 40.

The anode terminal of the first protection diode 4 is configured to include the p-type high-concentration diffusion layer 40, and the cathode terminal of the first protection diode 4 is configured to include the n-type semiconductor substrate 21 located below the p-type high-concentration diffusion layer 40. The n⁻-type epitaxial layer 22 constitutes an intrinsic semiconductor layer. That is, the first protection diode 4 has a p/n⁻/n structure.

The wiring 41 of FIG. 6 and the wiring 28 of FIG. 3 are electrically connected to each other, and are electrically connected to the gate terminal of the MOSFET 2 and the input terminal 10 via the resistance element 9.

Although the illustration of the MOSFET 2 is omitted here, the MOSFET 2 can take various known forms. For example, when the MOSFET 2 is formed on a semiconductor substrate SUB of Embodiment 1, a gate insulating film made of, for example, silicon oxide is formed on the epitaxial layer 22, and a gate electrode made of, for example, polycrystalline silicon is formed on the gate insulating film. This gate electrode constitutes the gate terminal of the MOSFET 2 illustrated in FIG. 1. By appropriately forming a p-type diffusion layer and an n-type diffusion layer in the epitaxial layer 22, these p-type diffusion layer and n-type diffusion layer can function as a channel region, a source region, and a drain region.

Although the present invention has been specifically described above based on the embodiments, the present invention is not limited to the embodiments described above and various modification may be made thereto without departing from the gist thereof.

What is claimed is:

1. A semiconductor device comprising:
an electrostatic protection circuit; and
a MOSFET including a gate terminal, wherein
the electrostatic protection circuit includes
a positive-side first power supply terminal,
a negative-side second power supply terminal,
a first protection diode including a first cathode terminal electrically connected to the first power supply terminal and a first anode terminal electrically connected to the gate terminal,
a second protection diode including a second anode terminal electrically connected to the second power supply terminal via a first resistance element, and a second cathode terminal electrically connected to the gate terminal, and
a bipolar transistor including a base terminal, an emitter terminal, and a collector terminal,
wherein the first protection diode, the second protection diode, the bipolar transistor, and the first resistance element are respectively formed on a semiconductor substrate made of silicon carbide, and
the bipolar transistor is electrically connected to the second anode terminal, the gate terminal, and the first power supply terminal.

2. The semiconductor device according to claim 1,
wherein the base terminal is electrically connected to the second anode terminal and the second power supply terminal via the first resistance element,
the emitter terminal is electrically connected to the gate terminal, the second cathode terminal, and the first anode terminal, and
the collector terminal is electrically connected to the first power supply terminal.

3. The semiconductor device according to claim 2,
wherein, when the anode current flowing through the second protection diode exceeds a predetermined value, the bipolar transistor is turned ON.

4. The semiconductor device according to claim 1, further comprising:
the semiconductor substrate that has a front surface and a back surface and is a first conductive type;
an epitaxial layer that is formed above the front surface of the semiconductor substrate, is made of silicon carbide, and is the first conductive type;
a diffusion layer that is formed on the epitaxial layer and is a second conductive type opposite to the first conductive type;
a first high-concentration diffusion layer that is formed in the diffusion layer, has an impurity concentration higher than that of the epitaxial layer, and is the first conductive type;
a second high-concentration diffusion layer that is formed in the diffusion layer so as to be separated from the first high-concentration diffusion layer, has an impurity concentration higher than that of the diffusion layer, and is the second conductive type; and
a back surface electrode that is formed on the back surface of the semiconductor substrate, wherein the base terminal is configured to include the diffusion layer, the emitter terminal is configured to include the first high-concentration diffusion layer, the collector terminal is configured to include the epitaxial layer and the semiconductor substrate located below the diffusion layer, and the first power supply terminal is configured to include the back surface electrode.

5. The semiconductor device according to claim 4, wherein the second cathode terminal is configured to include the first high-concentration diffusion layer, and the second anode terminal is configured to include the second high-concentration diffusion layer.

6. The semiconductor device according to claim 5, wherein the first resistance element is configured to include the diffusion layer located between the first high-concentration diffusion layer and the second high-concentration diffusion layer.

7. The semiconductor device according to claim 6, further comprising:

a third high-concentration diffusion layer that is formed in the epitaxial layer in a region different from the diffusion layer and is the second conductive type, wherein the first anode terminal is configured to include the third high-concentration diffusion layer, and the first cathode terminal is configured to include the semiconductor substrate located below the third high-concentration diffusion layer.

\* \* \* \* \*